United States Patent
Ogayu et al.

(10) Patent No.: US 12,355,338 B2
(45) Date of Patent: Jul. 8, 2025

(54) MOTOR DEVICE AND OIL PUMP DEVICE

(71) Applicant: MITSUBA Corporation, Gunma (JP)

(72) Inventors: Shun Ogayu, Gunma (JP); Hiroyuki Uchimura, Gunma (JP); Hiroki Saito, Gunma (JP); Tadamasa Endo, Gunma (JP); Masayuki Kamei, Gunma (JP)

(73) Assignee: MITSUBA Corporation, Gunma (JP)

( * ) Notice: Subject to any disclaimer, the term of this patent is extended or adjusted under 35 U.S.C. 154(b) by 0 days.

(21) Appl. No.: 18/644,113

(22) Filed: Apr. 24, 2024

(65) Prior Publication Data
US 2025/0015675 A1 Jan. 9, 2025

(30) Foreign Application Priority Data

Jul. 3, 2023 (JP) .................................. 2023-109547

(51) Int. Cl.
| | |
|---|---|
| *H02K 9/22* | (2006.01) |
| *F04B 17/03* | (2006.01) |
| *H02K 7/14* | (2006.01) |
| *H02K 11/30* | (2016.01) |
| *H02K 11/33* | (2016.01) |
| *H05K 7/20* | (2006.01) |

(52) U.S. Cl.
CPC ............. *H02K 9/227* (2021.01); *F04B 17/03* (2013.01); *H02K 7/14* (2013.01); *H02K 9/223* (2021.01); *H02K 11/30* (2016.01); *H02K 11/33* (2016.01); *H05K 7/20436* (2013.01); *H05K 7/20454* (2013.01); *H05K 7/2049* (2013.01); *H02K 2211/03* (2013.01); *H05K 7/2039* (2013.01)

(58) Field of Classification Search
CPC ..... H02K 9/223–227; H02K 11/30–38; H05K 7/20436–205
See application file for complete search history.

(56) References Cited

U.S. PATENT DOCUMENTS

2018/0219450 A1* 8/2018 Yamamoto ........... B62D 5/0406

FOREIGN PATENT DOCUMENTS

| DE | 102018132715 A1 | * | 6/2020 | ............. H02K 11/33 |
|---|---|---|---|---|
| EP | 1771053 A2 | * | 4/2007 | ............. H02K 11/33 |
| JP | 2007060775 A | * | 3/2007 | ............. H02K 11/38 |
| JP | 2021136825 | | 9/2021 | |

* cited by examiner

Primary Examiner — Laert Dounis
(74) Attorney, Agent, or Firm — JCIPRNET

(57) ABSTRACT

A motor device includes an electric motor, a control board on which a control circuit controlling the electric motor is mounted, a metal housing supporting a first surface of the control board, a resin cover attached to the housing to cover a second surface of the control board opposite to the first surface and the periphery of the control board, and a heat dissipation member dissipating heat generated by a heating element included in the control circuit to the housing. The heat dissipation member includes a heat reception plate fixed to the cover, and a heat transfer plate protruding toward the housing. The housing includes, outside the motor accommodation space, a reception portion receiving a protrusion end of the heat transfer plate inserted in a direction in which a rotation shaft extends, and a heat exhaust wall extending in the and coming into surface contact with the heat transfer plate.

7 Claims, 7 Drawing Sheets

MOTOR DEVICE AND OIL PUMP DEVICE

CROSS-REFERENCE TO RELATED APPLICATION

This application claims the priority benefits of Japanese application no. 2023-109547, filed on Jul. 3, 2023. The entirety of the above-mentioned patent application is hereby incorporated by reference herein and made a part of this specification.

BACKGROUND

Technical Field

The disclosure relates to a motor device and an oil pump device having the same mounted thereon.

Description of Related Art

In recent years, efforts have been made to promote sustainable development goals (2030 Agenda for Sustainable Development, adopted by the United Nations Summit on Sep. 25, 2015; hereinafter referred to as "SDGs"). In addition, a technology aiming at greatly reducing generation of waste through waste prevention, waste reduction, and product recycling and reuse in order to ensure sustainable production and consumption patterns is known.

In the related art, a so-called "mechanical and electrical integrated type" motor device in which an electric motor and a control board for controlling the electric motor are accommodated in a housing and integrated is known. Further, such a motor device is provided with a heat sink that exhausts, through the housing, heat emitted from a control circuit mounted on the control board.

For example, Patent Document 1 discloses a motor device in which a heat sink is fixed to the outer side of a motor accommodation space of a housing with bolts. More specifically, the heat sink of Patent Document 1 has one surface in a thickness direction in surface contact with a control board, and the other surface in the thickness direction in surface contact with an attachment surface of the housing perpendicular to a rotation axis of the motor.

PATENT DOCUMENTS

[0005] [Patent Document 1] Japanese Patent Laid-Open No. 2021-136825

However, since there is little space outside the motor accommodation space of the housing, it is difficult to secure a large attachment surface. As a result, since a contact area between the heat sink and the housing cannot be increased, it is difficult to improve heat exhaust efficiency. On the other hand, it is necessary to increase a size of the motor device in a radial direction in order to improve the heat exhaust efficiency with the motor device of Patent Document 1.

Therefore, the disclosure provides a technology for improving the efficiency of exhausting heat emitted from a control circuit without increasing a size of a motor device.

SUMMARY

The disclosure is a motor device including: an electric motor; a control board on which a control circuit for controlling the electric motor is mounted; a metal housing having a motor accommodation space for accommodating the electric motor and supporting a first surface of the control board at a position offset in a direction in which a rotation shaft of the electric motor extends from the motor accommodation space; a resin cover attached to the housing to cover a second surface of the control board opposite to the first surface and the periphery of the control board; and a heat dissipation member configured to dissipate heat generated by a heating element included in the control circuit to the housing, wherein the heat dissipation member includes a heat reception plate fixed to the cover at a position facing the heating element; and a heat transfer plate protruding toward the housing from the heat reception plate at a position away from the control board, and the housing includes, outside the motor accommodation space, a reception portion configured to receive a protrusion end of the heat transfer plate inserted in the direction in which the rotation shaft extends; and a heat exhaust wall extending in the direction in which the rotation shaft extends and coming into surface contact with the heat transfer plate received in the reception portion.

DESCRIPTION OF THE EMBODIMENTS

According to the disclosure, it is possible to improve the efficiency of exhausting heat emitted from the control circuit without increasing a size of the motor device. Problems, configurations, and effects other than those described above will be made clear by the following description of the embodiments.

Figure 1:
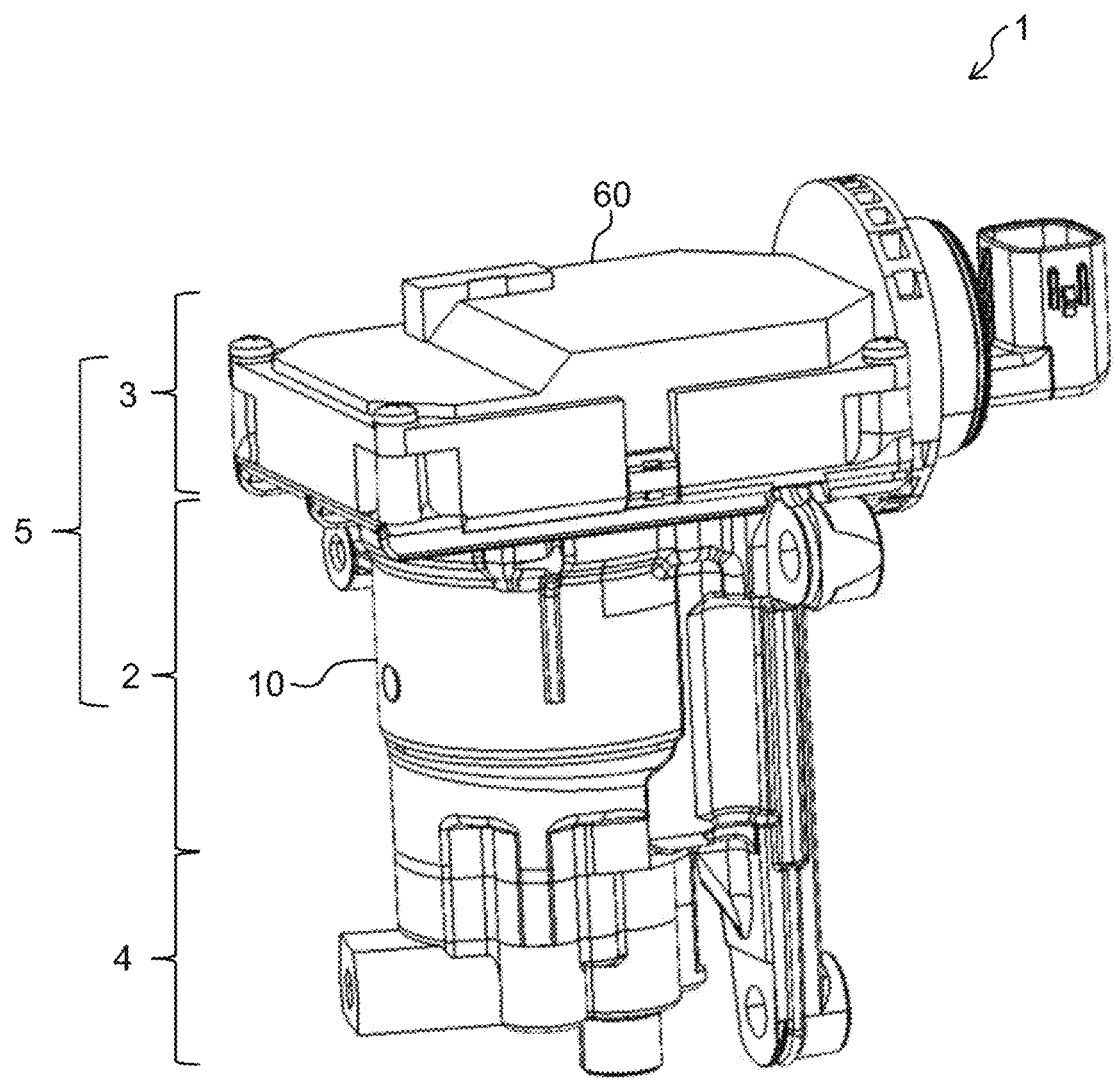
FIG. 1 is an external perspective view of an oil pump device according to the present embodiment.

Hereinafter, an oil pump device 1 according to an embodiment of the disclosure will be described with reference to the drawings. FIG. 1 is an external perspective view of the oil pump device 1 according to the present embodiment.

The oil pump device 1 according to the present embodiment supplies oil (for example, lubricating oil) to an engine clutch or a transmission mechanism clutch mounted on, for example, an automobile. However, the use of the oil pump device 1 is not limited thereto.

As shown in FIG. 1, the oil pump device 1 is a so-called "electric oil pump" including a motor unit 2, a control unit 3, and a pump unit 4. Further, the motor unit 2 and the control unit 3 constitute a so-called "mechanical and electrical integrated type" motor device 5 independently of the pump unit 4. The motor device 5 is not limited to driving the pump unit 4, and may also drive a cooling fan or a wiper.

The motor unit 2 includes an electric motor 6 (see FIG. 7) that rotates (generates a driving force) according to a driving power supplied from the control unit 3. Although a specific example of the electric motor 6 is not particularly limited, for example, an inner rotor type brushless motor can be adopted. Since a configuration of the electric motor 6 is already well known, detailed description will be omitted. The control unit 3 supplies a power supplied from an external device (not shown) to the electric motor 6 as a drive power. A specific configuration of the control unit 3 will be described later with reference to FIG. 2 and subsequent figures. The pump unit 4 receives the driving force of the motor unit 2 and pumps oil. Since a configuration of the pump unit 4 is already well known, detailed description thereof will be omitted.

The motor unit 2, the control unit 3, and the pump unit 4 are disposed adjacent to each other in a direction in which a rotation shaft 7 (see FIG. 7) of the electric motor 6, which will be described later, extends. More specifically, the control unit 3 is disposed adjacent to one side of the rotation shaft 7 in the extending direction with respect to the motor unit 2 disposed at a center, and the pump unit 4 is disposed adjacent to the other side of the rotation shaft 7 in the extending direction.

The oil pump device 1 includes the housing 10 that accommodates the motor unit 2, the control unit 3, and the pump unit 4. The housing 10 is made of, for example, a metal material such as die-cast aluminum. The housing 10 is not limited to an integral type in which the motor unit 2, the control unit 3, and the pump unit 4 are collectively accommodated, and may be constructed in parts as separate bodies.

Figure 2:
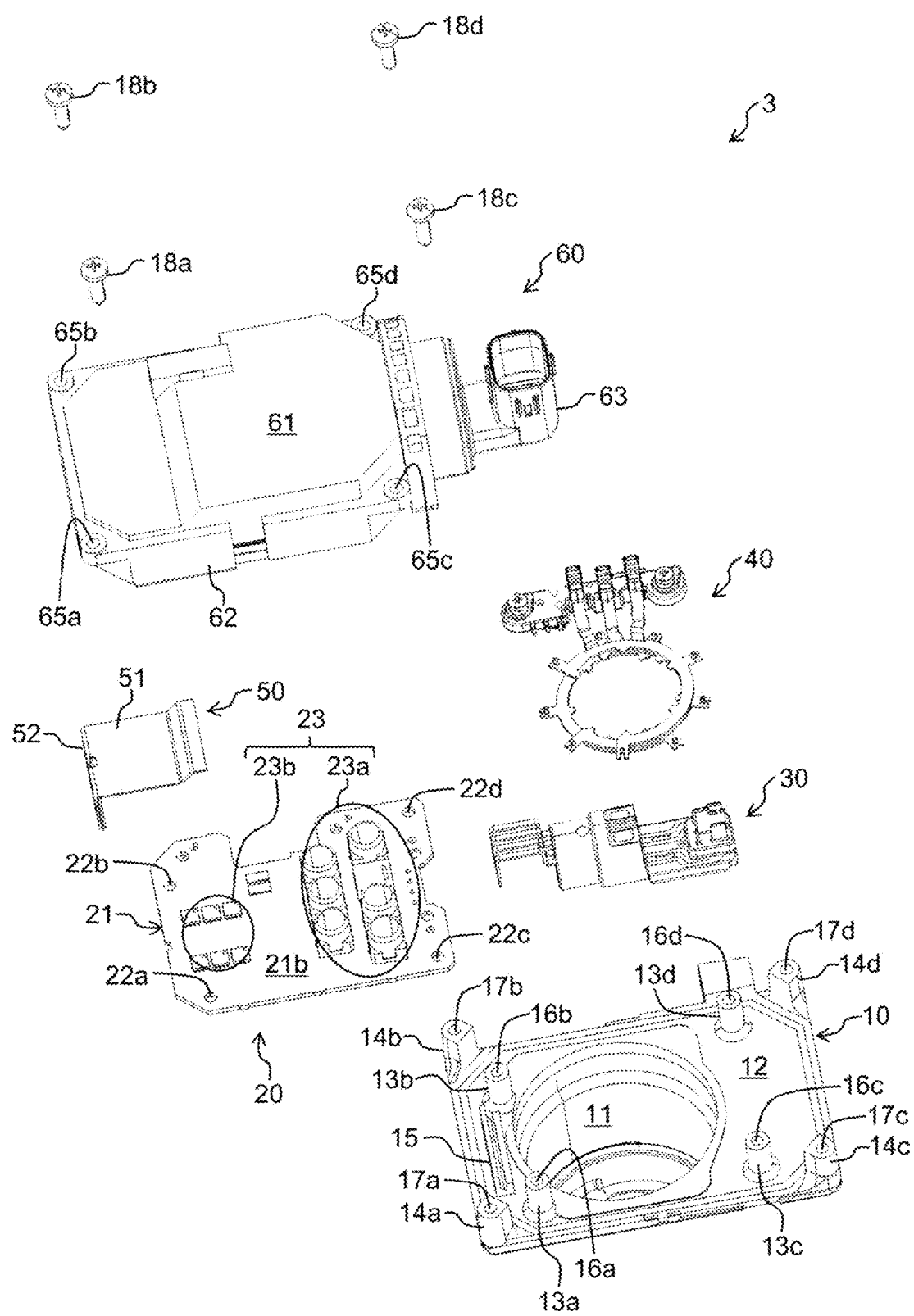
FIG. 2 is an exploded perspective view of a control unit.
Figure 3:
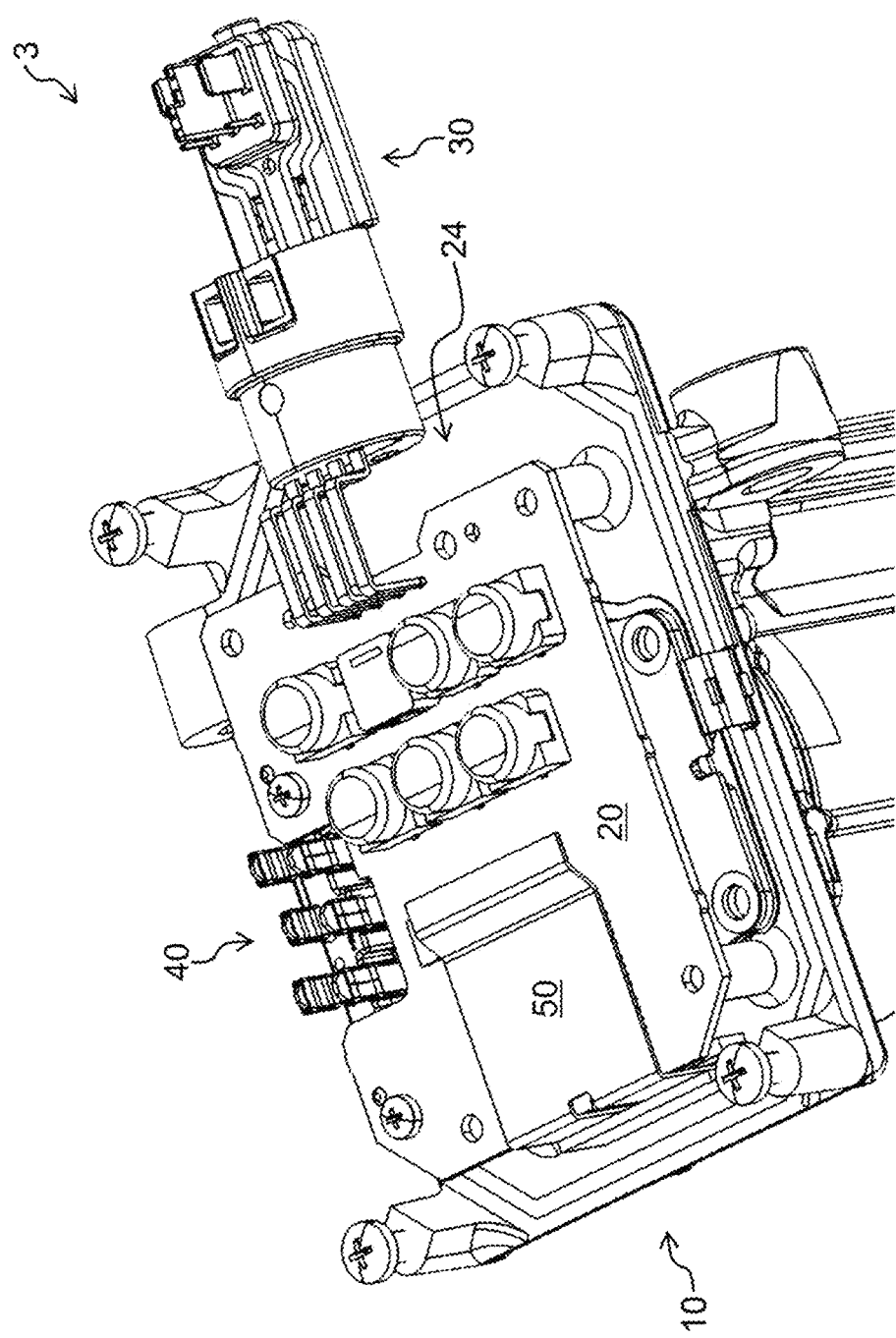
FIG. 3 is a perspective view of the control unit in a state where a cover has been removed.

FIG. 2 is an exploded perspective view of the control unit 3. FIG. 3 is a perspective view of the control unit 3 in a state where a cover 60 has been removed. As shown in FIGS. 2 and 3, the control unit 3 mainly includes the housing 10, a control board 20, a connector unit 30, a relay unit 40, a heat sink 50, and the cover 60. Hereinafter, the extending direction of the rotation shaft 7 will be simply referred to as an "axial direction", and a direction perpendicular to the extending direction of the rotation shaft 7 (a radial direction of the rotation shaft 7) will simply be referred to as a "radial direction".

As shown in FIG. 2, a motor accommodation space 11 that accommodates the electric motor 6 is formed in the housing 10. The motor accommodation space 11 is a space having a generally cylindrical external shape. Furthermore, the housing 10 includes a support surface 12 that supports components (20 to 60) of the control unit 3. The support surface 12 is a surface that stretches in the radial direction at a position offset in the axial direction from the motor accommodation space 11. The support surface 12 has a generally rectangular external shape when viewed from the axial direction.

On the support surface 12, a plurality of (in the present embodiment, four) support protrusions 13a, 13b, 13c, and 13d, a plurality of (in the present embodiment, four) screw seats 14a, 14b, 14c, and 14d, and a heat sink support portion 15 are provided.

The support protrusions 13a to 13d protrude in the axial direction from the support surface 12 at different positions on the support surface 12 (typically, positions surrounding the motor accommodation space 11). The support protrusions 13a to 13d support the control board 20 at tips thereof. Furthermore, second positioning holes 16a, 16b, 16c, and 16d that receive positioning pins 64a to 64d, which will be described later, are formed in the support protrusions 13a to 13d. The second positioning holes 16a to 16d extend toward base ends from tips of the support protrusions 13a to 13d.

The screw seats 14a to 14d protrude in the axial direction from the support surface 12 at different positions on the support surface 12 (typically, positions surrounding the motor accommodation space 11). Screw holes 17a, 17b, 17c, and 17d communicating with screw holes 65a to 65d of the cover 60 when the cover 60 is attached to the housing 10 are formed in the screw seats 14a to 14d. The cover 60 is fixed to the housing 10 by screwing the screws 18a to 18d into the communicating screw holes 17a to 17d and 65a to 65d.

The heat sink support portion 15 supports an end portion of the heat sink 50. The heat sink support portion 15 is provided at a position radially away from the motor accommodation space 11. Further, the heat sink support portion 15 is provided linearly in parallel with one of four sides constituting an outer edge of the support surface 12 at a position adjacent to the side. A specific configuration of the heat sink support portion 15 will be described later with reference to FIGS. 6A and 6B.

Figure 6A:
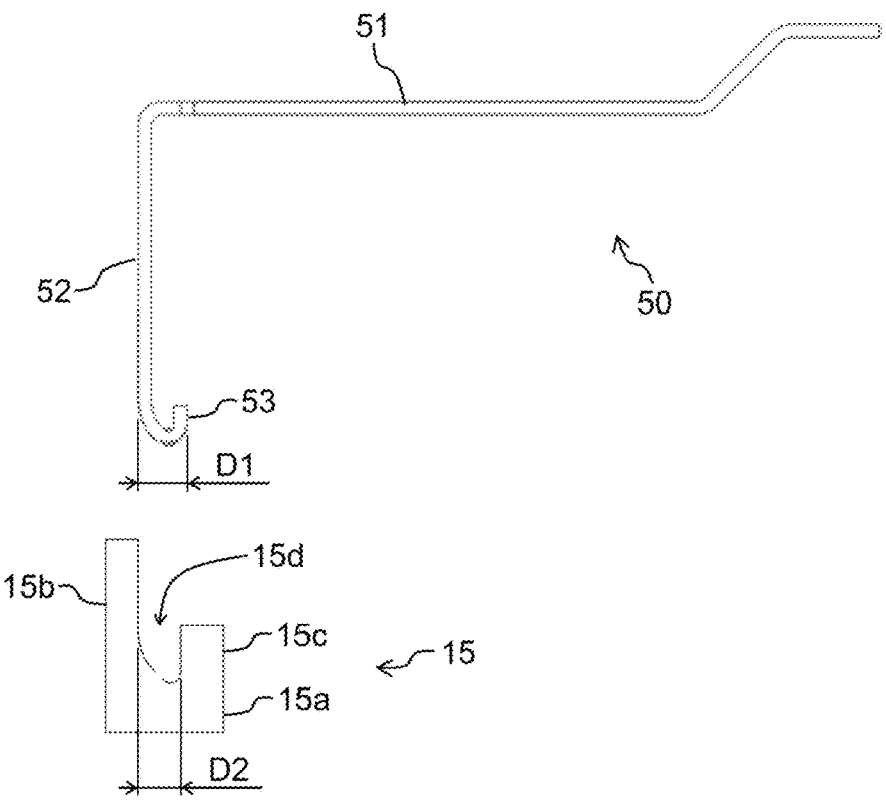
FIGS. 6A and 6B are cross-sectional views respectively showing before and after a protrusion end of a heat transfer plate is inserted into a groove of a heat sink support portion.
Figure 6B:
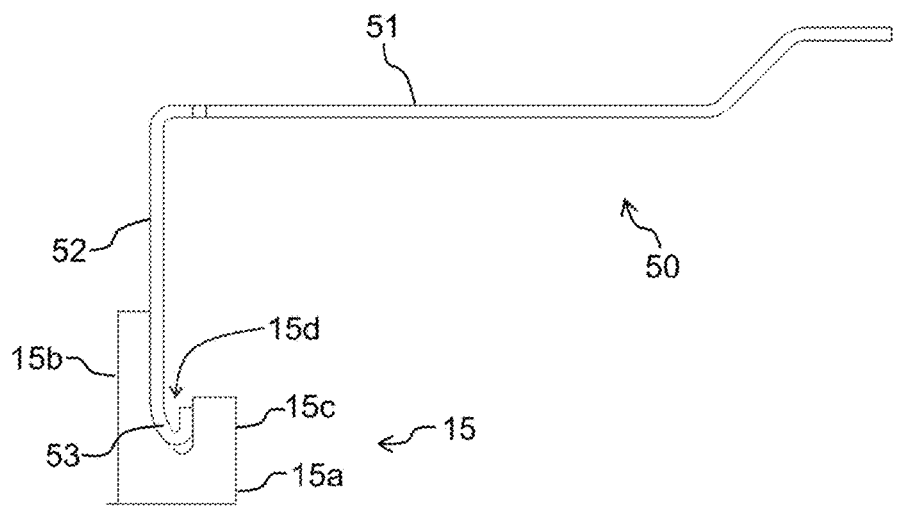

The control board 20 includes a board 21. The board 21 is a flat member having a generally rectangular external shape. Further, the board 21 has a first surface 21a and a second surface 21b (see FIG. 7). The first surface 21a is a surface on one side of the board 21 in the thickness direction (a side facing the motor accommodation space 11). The second surface 21b is the other surface of the board 21 in the thickness direction (the side opposite to the first surface 21a). As shown in FIGS. 6A and 6B, the board 21 is disposed to overlap the motor accommodation space 11 when viewed from the axial direction. Further, an outer edge portion of the board 21 is located outside the motor accommodation space 11 when viewed from the axial direction.

First positioning holes 22a, 22b, 22c, and 22d penetrating in the thickness direction are formed in the board 21. The first positioning holes 22a to 22d are formed at positions corresponding to the support protrusions 13a to 13d at the outer edge portion of the board 21. When the board 21 is supported by the tips of the support protrusions 13a to 13d, the first positioning holes 22a to 22d and the second positioning holes 16a to 16d corresponding thereto communicate with each other. When the positioning pins 64a to 64d are inserted into the first positioning holes 22a to 22d and the second positioning holes 16a to 16d corresponding thereto, the housing 10, the control board 20, and the cover 60 are positioned.

A plurality of circuit elements 23a and 23b constituting a control circuit 23 that controls the electric motor 6 are mounted on one or both of the first surface 21a and the second surface 21b of the board 21. Furthermore, at least a portion (for example, the circuit element 23b) of the circuit elements 23a and 23b is a heat generation element that generates a large amount of heat. The circuit element 23b is mounted on the second surface 21b of the board 21 near the side (the left side in FIG. 3) different from the side (the right side in FIG. 3) where the connector unit 30 is disposed and the side (the top side in FIG. 3) where the relay unit 40 is disposed among the four sides constituting the outer edge of the board 21.

The connector unit 30 connects the external device to the control circuit 23. The connector unit 30 includes a pair of power lines for supplying a drive power output from the external device to the control circuit 23, and a pair of signal lines for transmitting and receiving control signals between the external device and the control circuit 23. The connector unit 30 is housed in a connector holder 63 of the cover 60. The connector unit 30, for example, is inserted and integrally molded when the cover 60 is injection molded. The relay unit 40 connects the control circuit 23 to the electric motor 6 (more specifically, a coil). The relay unit 40 supplies the drive power output from the control circuit 23 to the coil. Accordingly, the electric motor 6 rotates.

Figure 4A:
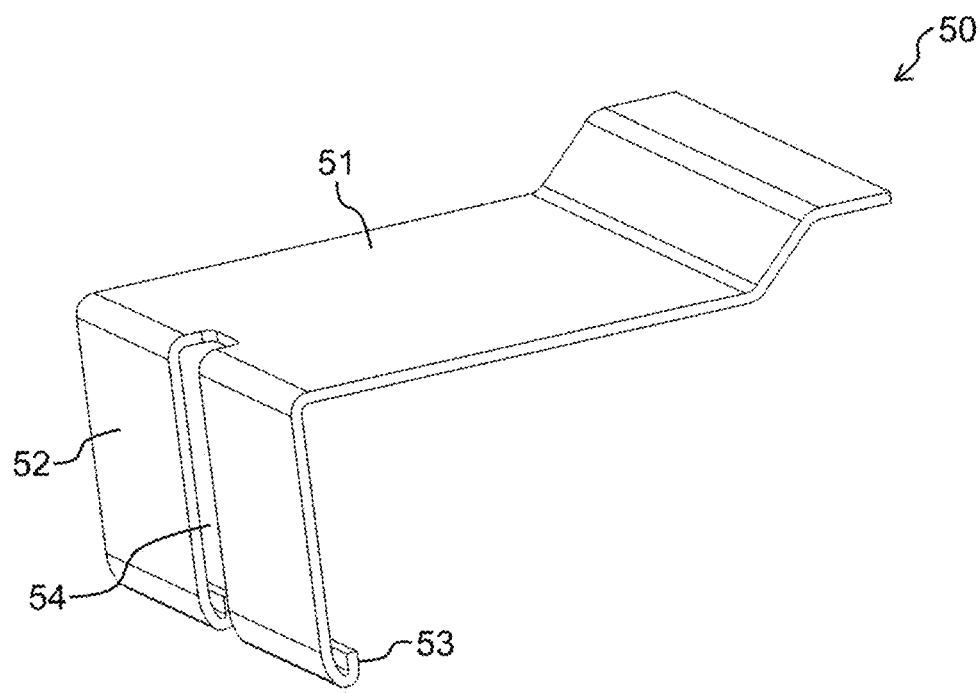
FIGS. 4A and 4B are perspective views of a heat sink.
Figure 4B:
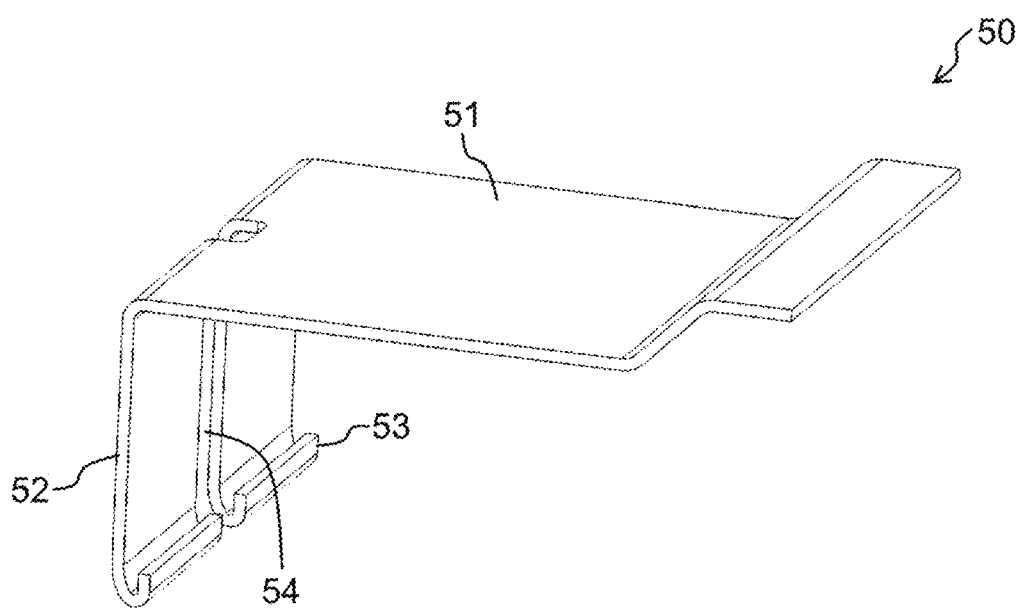

FIGS. 4A and 4B are perspective view of the heat sink 50. The heat sink 50 is a heat dissipation member that radiates heat generated by a circuit element 23b to the housing 10.

The heat sink 50 is formed of a metal material with high thermal conductivity (for example, copper). For example, when a flat plate is pressed, the heat sink 50 is formed in a shape shown in FIGS. 4A and 4B.

As shown in FIGS. 4A and 4B, the heat sink 50 includes a heat reception plate 51 and the heat transfer plate 52. The heat sink 50 is bent so that the heat reception plate 51 and the heat transfer plate 52 intersect (are orthogonal to) each other. That is, the heat sink 50 has a generally L-shaped external shape. Further, a protrusion end 53 (an end portion opposite to the heat reception plate 51) of the heat transfer plate 52 is bent into a U-shape (or J-shape) by a tip of the heat transfer plate 52 being folded back toward the heat reception plate 51. Furthermore, a slit 54 extending toward the heat reception plate 51 from the protrusion end 53 is formed in the heat transfer plate 52.

Figure 5:
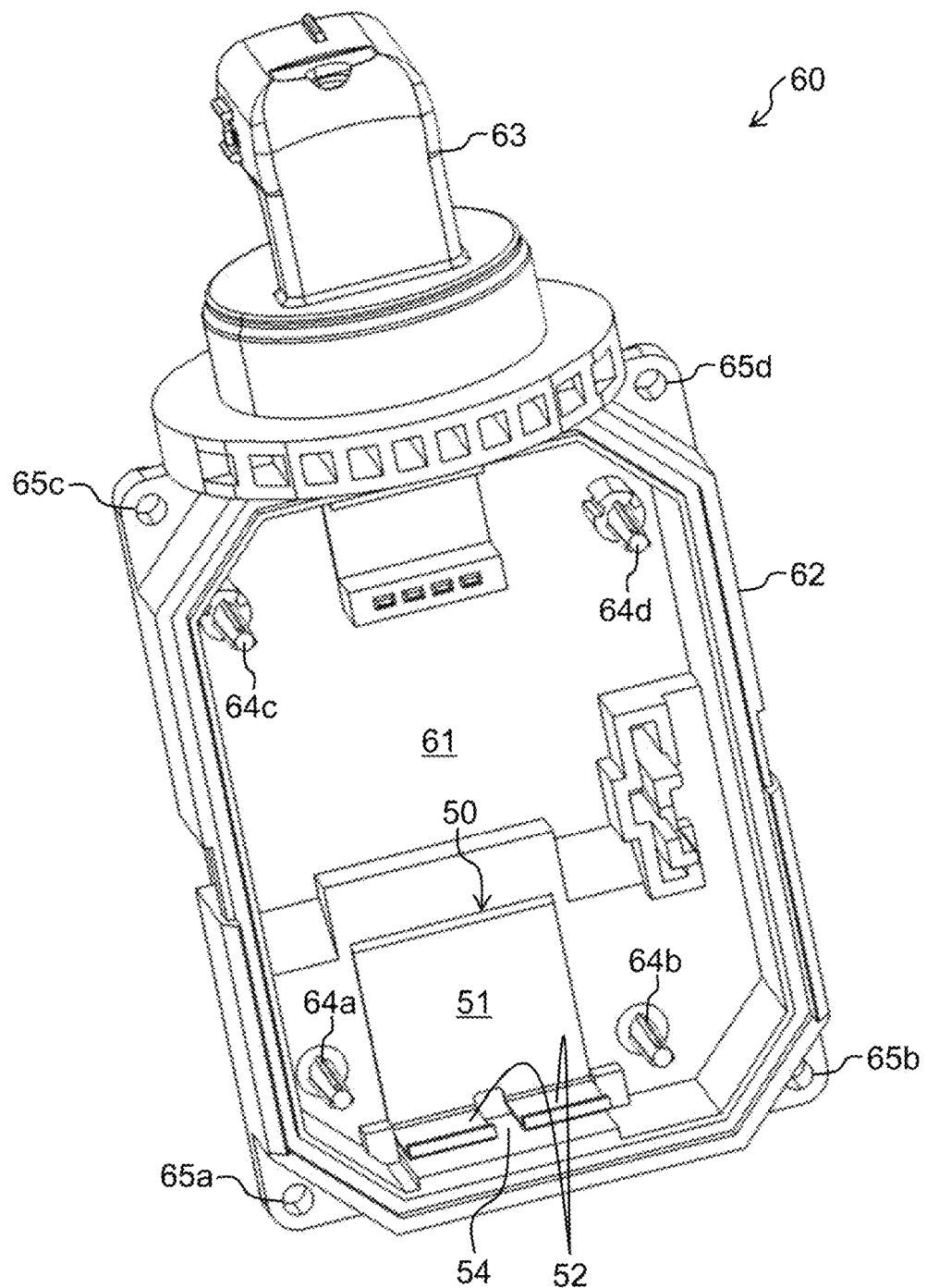
FIG. 5 is a perspective view of the cover viewed from the back side.

FIG. 5 is a perspective view of the cover 60 viewed from the back side. The cover 60 is integrally molded, for example, by injection molding a resin material. That is, the cover 60 is formed of a material that has a lower thermal conductivity than the housing 10 and is lighter than the housing 10. As shown in FIGS. 2 and 5, the cover 60 mainly includes a ceiling wall 61, a side wall 62, the connector holder 63, and a plurality of positioning pins 64a, 64b, 64c, and 64d.

The ceiling wall 61 is a portion that covers the second surface 21b of the control board 20 (board 21). When the cover 60 is attached to the housing 10, the ceiling wall 61 faces the second surface 21b at a predetermined interval in the axial direction from the control board 20. Further, the heat reception plate 51 of the heat sink 50 is attached to a surface (back surface) of the ceiling wall 61 facing the second surface 21b. The heat reception plate 51, for example, may be attached to the ceiling wall 61 by thermal caulking, or may be inserted when the cover 60 is injection molded. Furthermore, screw holes 65a, 65b, 65c, and 65d penetrating in the thickness direction are formed at four corners of the ceiling wall 61.

The side wall 62 is a frame-shaped portion that covers the periphery of the control board 20. The side wall 62 protrudes toward the housing 10 from an outer edge portion of the ceiling wall 61 (that is, in the axial direction). When the housing 10 is attached to the cover 60, a tip of the side wall 62 abuts the support surface 12 of the housing 10. Accordingly, a board accommodation space 24 for housing the control board 20 is formed between the housing 10 and the cover 60 (more specifically, the support surface 12, the ceiling wall 61, and the side wall 62). The connector holder 63 is provided outside the side wall 62 to hold the connector unit 30.

The positioning pins 64a to 64d protrude in the axial direction from the back surface of the ceiling wall 61 inside the side wall 62. When the positioning pins 64a to 64d are inserted into the first positioning holes 22a to 22d, the control board 20 in a state where the second surface 21b is directed to the ceiling wall 61 is attached to the cover 60. When the positioning pins 64a to 64d are inserted into the second positioning holes 16a to 16d in this state, the screw holes 17a to 17d and 65a to 65d communicate with each other, and the protrusion end 53 of the heat transfer plate 52 is inserted into a groove 15d of the heat sink support portion 15 in the axial direction, as will be described later. The screws 18a to 18d are screwed into the communicating screw holes 17a to 17d and 65a to 65d in a state where the housing 10, the control board 20, the heat sink 50, and the cover 60 are positioned, so that the cover 60 is attached to the housing 10.

Figure 7:
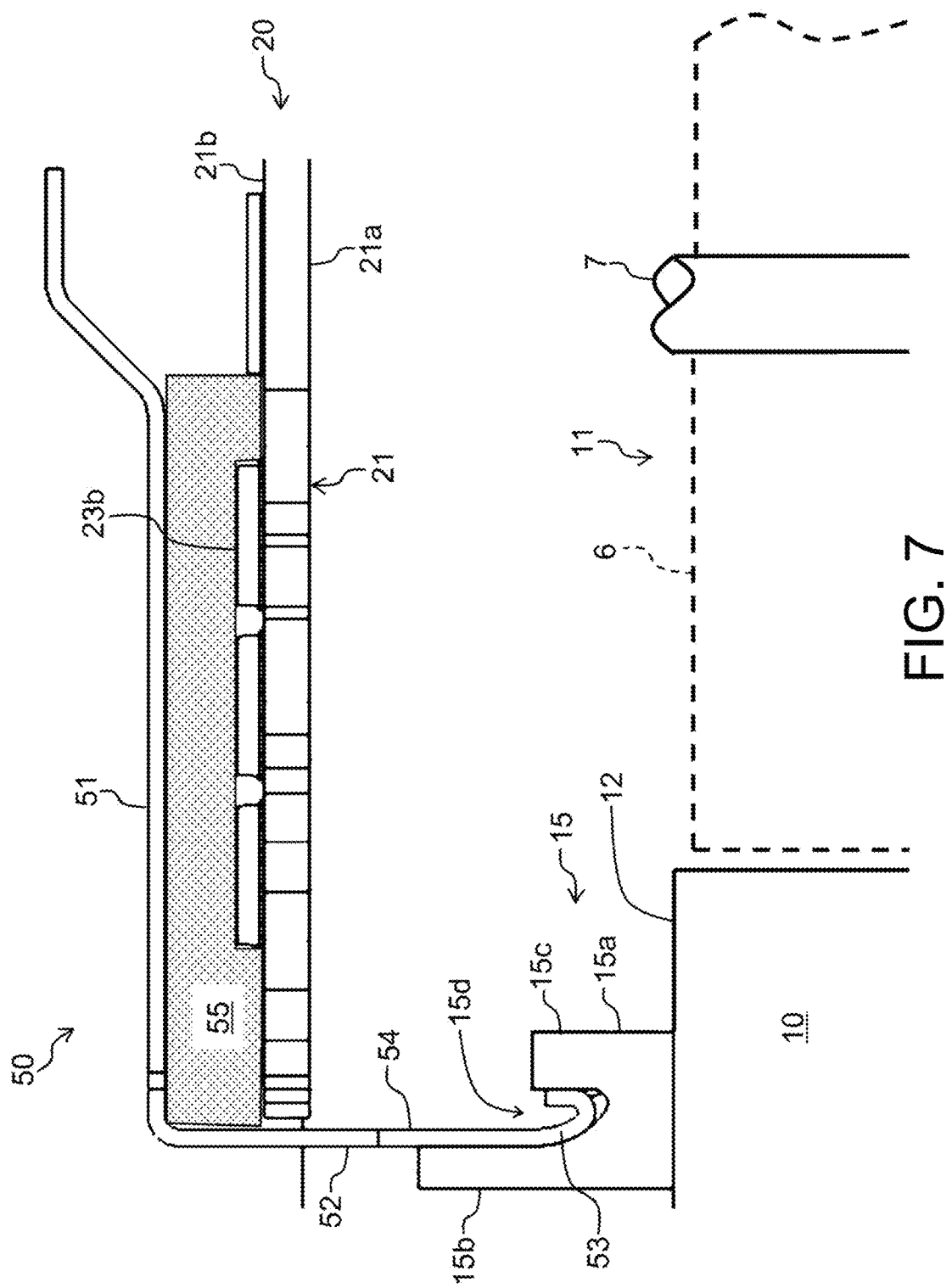
FIG. 7 is a cross-sectional view showing a positional relationship between the heat sink support portion, a control board, and the heat sink.

FIGS. 6A and 6B are cross-sectional views showing before and after the protrusion end 53 of the heat transfer plate 52 is inserted into the groove 15d of the heat sink support portion 15. FIG. 7 is a cross-sectional view showing a positional relationship among the heat sink support portion 15, the control board 20, and the heat sink 50.

As shown in FIGS. 6 and 7, the heat sink support portion 15 includes a base portion 15a, a heat exhaust wall 15b, and an opposing wall 15c. The base portion 15a is a portion supported by the support surface 12. The heat exhaust wall 15b and the opposing wall 15c extend in the axial direction (that is, toward the cover 60) from the base portion 15a at a predetermined interval therebetween in a thickness direction of the heat transfer plate 52. Further, the base portion 15a, the heat exhaust wall 15b, and the opposing wall 15c extend in the width direction in the heat transfer plate 52 along the support surface 12.

A groove 15d is defined by the base portion 15a, the heat exhaust wall 15b, and the opposing wall 15c. The groove 15d is an example of a reception portion that receives the protrusion end 53 of the heat transfer plate 52 inserted in the axial direction. The groove 15d extends linearly in a direction perpendicular to the thickness direction of the heat transfer plate 52 on the support surface 12. However, a shape of the groove 15d is not limited thereto, and the groove 15d may be bent along an outer periphery of the motor accommodation space 11.

As shown in FIG. 6A, a diameter D1 of the bent protrusion end 53 in a natural state is larger than a width dimension D2 of the groove 15d. Here, the natural state of the protrusion end 53 is a state where no external force other than gravity is applied (typically, a state before the protrusion end 53 is inserted into the groove 15d). Further, the width dimension D2 of the groove 15d corresponds to an interval between the heat exhaust wall 15b and the opposing wall 15c. As shown in FIG. 6B, the bent protrusion end 53 is inserted into the groove 15d in an elastically contracted state. When the protrusion end 53 is inserted into the groove 15d, the heat transfer plate 52 and the heat exhaust wall 15b come into surface contact with each other.

As shown in FIG. 7, the heat reception plate 51 faces the second surface 21b (more specifically, the circuit element 23b) of the control board 20 at a predetermined interval therefrom in the axial direction. In other words, the heat reception plate 51 and the control board 20 are disposed in parallel with each other at a predetermined distance therebetween in the axial direction. Furthermore, a heat dissipation agent 55 is interposed between the heat reception plate 51 and the circuit element 23b. In other words, the heat reception plate 51 is in contact with the circuit element 23b via the heat dissipation agent. The heat dissipation agent 55 is made of, for example, a thermosetting resin with high thermal conductivity.

Further, as shown in FIG. 7, the heat transfer plate 52 protrudes toward the housing 10 (more specifically, the heat sink support portion 15) from the heat reception plate 51 at a position away from the control board 20. More specifically, the heat transfer plate 52 protrudes toward the housing 10 while facing a side (the left side in FIG. 2) closest to the circuit element 23b among a plurality of sides defining the outer edge of the control board 20. Furthermore, the slit 54 extends to a position closer to the heat reception plate 51 than the heat exhaust wall 15b.

According to the embodiment, for example, the following effects are achieved.

According to the embodiment, the heat exhaust wall 15b and the heat transfer plate 52 extending in the axial direction are brought into surface contact with each other to radiate the heat generated by the circuit element 23b to the housing 10. Here, since a size in the axial direction of the board accommodation space 24 inherently has a margin corresponding to heights of the circuit elements 23a and 23b mounted on the board 21 and heights of the support protrusions 13a to 13d, it is easy to increase a contact area between the heat exhaust wall 15b and the heat transfer plate 52.

This makes it possible to improve the efficiency of exhausting the heat released from the control circuit 23 without increasing a size of the oil pump device 1 (motor device 5), as compared to Patent Document 1. As a result, since deterioration of the control circuit 23 due to heat is curbed, this contributes to extension of the life of the oil pump device 1 (motor device 5) and to prevention of the generation of waste. Furthermore, since it is possible to reduce a weight of the oil pump device 1 as compared to with a cover made of metal by adopting the cover 60 made of a resin, this can contribute to carbon neutrality.

Furthermore, according to the embodiment, it is possible to prevent the protrusion end 53 of the heat transfer plate 52 from getting caught at the time of entering the groove 15d by forming the protrusion end 53 of the heat transfer plate 52 in a bent shape. As a result, it is possible to smoothly attach the heat sink 50 (in other words, the cover 60) to the housing 10. However, the shape of the protrusion end 53 is not limited to a bent shape.

Further, according to the embodiment, the diameter D1 of the protrusion end 53 in a natural state is made larger than the width D2 of the groove 15d, and the protrusion end 53 is inserted into the groove 15d while being elastically contracted. Accordingly, since the heat transfer plate 52 comes into close contact with the heat exhaust wall 15b due to an elastic return force of the protrusion end 53, the heat exhaust efficiency is further improved. However, a relationship between D1 and D2 is not limited to the above-described example.

Furthermore, according to the embodiment, the elastic deformability of the heat transfer plate 52 is improved by providing the slit 54 in the heat transfer plate 52. Accordingly, since the heat transfer plate 52 supported by the heat sink support portion 15 in an elastically deformed state comes into close contact with the heat exhaust wall 15b due to the elastic return force, the heat exhaust efficiency is further improved. Further, the heat transfer plate 52 can elastically deform and absorb manufacturing errors or assembly errors of the heat sink support portion 15, the heat sink 50, and the cover 60. A shape, position, number, and width of the slit 54 are appropriately selected depending on a material, thickness, or the like of the heat sink 50. Further, the slit 54 can be omitted.

Further, according to the embodiment, it is possible to reduce a size of the heat sink 50 by providing the heat transfer plate 52 on the side closest to the circuit element 23b that generates a large amount of heat among the plurality of sides defining the outer edge of the control board 20. As a result, since a heat transfer path from the circuit element 23b to the heat sink support portion 15 is shortened, the heat exhaust efficiency is further improved. However, the disposition of the heat transfer plate 52 is not limited to the above-described example. As another example, a plurality of heat transfer plates 52 extending in different directions (for example, toward the left side and downward in FIG. 2) from the heat reception plate 51 may be provided.

Furthermore, according to the embodiment, the heat exhaust efficiency is further improved by bringing the heat reception plate 51 into contact with the circuit element 23b mounted on the second surface 21b via the heat dissipation agent 55, compared to a board being interposed between the heat generation element and the heat sink as in Patent Document 1. However, a positional relationship between the circuit element 23b and the heat reception plate 51 is not limited to the above example.

The embodiments of the disclosure have been described above. The disclosure is not limited to the embodiments described above, and includes various modification examples. For example, the above-described embodiments have been described in detail to explain the disclosure in an easy-to-understand manner, and the disclosure is not necessarily limited to that including all the described configurations. Further, it is possible to replace a part of the configuration of the present embodiment with the configuration of other embodiments, and it is also possible to add the configuration of other embodiments to the configuration of the present embodiment. Furthermore, it is possible to perform addition, deletion, or replacement of other configurations with respect to some of the configurations of the present embodiment.

What is claimed is:

1. A motor device comprising:
   an electric motor;
   a control board on which a control circuit for controlling the electric motor is mounted;
   a metal housing having a motor accommodation space for accommodating the electric motor and supporting a first surface of the control board at a position offset from the motor accommodation space in a direction in which a rotation shaft of the electric motor extends;
   a resin cover attached to the housing to cover a second surface on a side opposite to the first surface of the control board and the periphery of the control board; and
   a heat dissipation member configured to dissipate heat generated by a heating element included in the control circuit to the housing, wherein
   the heat dissipation member includes
   a heat reception plate fixed to the cover at a position facing the heating element; and
   a heat transfer plate protruding toward the housing from the heat reception plate at a position away from the control board, and
   the housing includes, outside the motor accommodation space,
   a reception portion configured to receive a protrusion end of the heat transfer plate inserted in the direction in which the rotation shaft extends; and
   a heat exhaust wall extending in the direction in which the rotation shaft extends and coming into surface contact with the heat transfer plate received in the reception portion.

2. The motor device according to claim 1, wherein the protrusion end is bent by a tip of the heat transfer plate being folded back toward the heat reception plate.

3. The motor device according to claim 2, wherein
   the reception portion is a groove whose one end in a width direction is defined by the heat exhaust wall, and
   the bent protrusion end has a diameter in a natural state larger than a width dimension of the groove, and is inserted into the groove in an elastically contracted state.

4. The motor device according to claim 1, wherein the heat transfer plate has a slit formed therein, the slit extending to a position closer to the heat reception plate than the heat exhaust wall from the protrusion end.

5. The motor device according to claim 1, wherein the heat transfer plate protrudes toward the housing while facing a side closest to the heating element among a plurality of sides defining an outer edge of the control board.

6. The motor device according to claim 1, wherein
the heating element is mounted on the second surface of the control board, and
the heat reception plate is in contact with the heating element via a heat dissipating agent.

7. An oil pump device comprising:
the motor device according to claim 1; and
a pump unit configured to pump oil using a driving force of the electric motor.

\* \* \* \* \*